(12) United States Patent
Martin

(10) Patent No.: US 7,927,969 B2
(45) Date of Patent: Apr. 19, 2011

(54) CLEANING OF PHOTOLITHOGRAPHY MASKS

(75) Inventor: Christophe Martin, Aix-En-Provence (FR)

(73) Assignee: STMicroelectronics S.A., Montrouge (FR)

( * ) Notice: Subject to any disclaimer, the term of this patent is extended or adjusted under 35 U.S.C. 154(b) by 1004 days.

(21) Appl. No.: 11/715,125

(22) Filed: Mar. 7, 2007

(65) Prior Publication Data

US 2007/0209682 A1 Sep. 13, 2007

(30) Foreign Application Priority Data

Mar. 8, 2006 (FR) ...................... 06 50805

(51) Int. Cl.
*H01L 21/331* (2006.01)
*H01L 21/425* (2006.01)
*H01L 21/76* (2006.01)
(52) U.S. Cl. ......... 438/445; 438/377; 438/448; 438/531
(58) Field of Classification Search .................. 438/377, 438/445, 448, 531
See application file for complete search history.

(56) References Cited

U.S. PATENT DOCUMENTS

| 4,756,765 | A  | * | 7/1988  | Woodroffe ...................... 134/1 |
| 5,830,279 | A  |   | 11/1998 | Hackenberg |
| 6,427,703 | B1 | * | 8/2002  | Somekh ........................ 134/1.1 |
| 6,715,495 | B2 | * | 4/2004  | Dao et al. ..................... 134/1.1 |
| 6,829,035 | B2 | * | 12/2004 | Yogev ............................ 355/30 |
| 2002/0083957 | A1 | * | 7/2002  | Reid ................................. 134/1 |
| 2004/0090605 | A1 |   | 5/2004  | Yogev |
| 2005/0110985 | A1 | * | 5/2005  | Yogev ........................ 356/237.1 |
| 2006/0243300 | A1 | * | 11/2006 | Klingbeil et al. ................. 134/1 |

FOREIGN PATENT DOCUMENTS

EP 1 411 388 A1 4/2004

OTHER PUBLICATIONS

French Search Report from French Patent Application 06/50805, filed Mar. 8, 2006.

* cited by examiner

*Primary Examiner* — Matthew C Landau
*Assistant Examiner* — James M Mitchell
(74) *Attorney, Agent, or Firm* — Lisa K. Jorgenson; James H. Morris; Wolf, Greenfield & Sacks, P.C.

(57) ABSTRACT

A method and an equipment for cleaning masks used for photolithography steps, including at least one step of thermal treatment under pumping at a pressure lower than the atmospheric pressure and at a temperature greater than the ambient temperature.

15 Claims, 1 Drawing Sheet

CLEANING OF PHOTOLITHOGRAPHY MASKS

BACKGROUND OF THE INVENTION

1. Field of the Invention

The present invention generally relates to the electronics industry and, more specifically, the cleaning of masks used to form patterns on a substrate.

2. Discussion of the Related Art

Currently, the cleaning of the masks used in the electronics industry is performed in an aqueous medium by means of solutions generally containing sulfates. This processing is performed outside of the semiconductor manufacturing installations and exhibits several disadvantages.

A first disadvantage is the routing of the masks to be cleaned to another installation, generally that of the mask manufacturer. Indeed, the controlled atmosphere of the "clean room" should be respected as much as possible and any entrance-exit of material poses a problem.

Another disadvantage is the use of solutions based on sulfates for the cleaning. Indeed, gas residues ($H_2SO_4$) remain present at the return of the mask in the clean room. The presence of ammonia ($NH_3$) in the clean room (compound widely used in semiconductor manufacturing) then favors the subsequent growth of ammonium sulfate salts $(NH_4)_2SO_4$ at the mask surface. This pollution adds to that coming from the other gases present in the installation.

Further, all the processings aiming at decreasing the deposition of salts on masks (for example, the maintaining of a controlled air flow during the exposure to light) only space apart the cleanings and impose constraints in the clean room, which increases the general manufacturing costs of electronic circuits.

SUMMARY OF THE INVENTION

The present invention aims at overcoming all or part of the disadvantages of methods for cleaning masks used in photolithography.

The present invention more specifically aims at a solution particularly well adapted to the microelectronics industry.

The present invention also aims at a solution capable of being implemented in a clean room, that is, in installations where the masks are used.

To achieve all or part of these objects, as well as others, the present invention provides a method for cleaning masks used for photolithography steps, comprising at least one step of thermal treatment under pumping at a pressure lower than the atmospheric pressure and at a temperature greater than the ambient temperature.

According to an embodiment of the present invention, the temperature of the thermal treatment is lower than 100° C., preferably on the order of 80° C.

According to an embodiment of the present invention, the thermal treatment is performed under a pressure lower than 0.01 Pa.

According to an embodiment of the present invention, the thermal treatment is obtained by a radiation focused on the surface to be cleaned.

The present invention also provides a method for the method comprises a step of setting back to the atmospheric pressure under a neutral gas at the end of the thermal treatment.

According to an embodiment of the present invention, the thermal treatment is carried on as long as the concentration of at least one species of gas sublimated by the processing is greater than a threshold.

According to an embodiment of the present invention, the thermal treatment is carried on as long as salts are present at the mask surface.

The present invention also provides a photolithography mask cleaning equipment, comprising:

a thermal treatment chamber;

a robotized equipment for transferring the masks between the chamber and an external storage box; and a circuit for pumping the gases from the processing chamber.

According to an embodiment of the present invention, the equipment further comprises a circuit of neutral gas supply into the processing chamber.

According to an embodiment of the present invention, the equipment comprises a control unit.

The foregoing and other objects, features, and advantages of the present invention will be discussed in detail in the following non-limiting description of specific embodiments in connection with the accompanying drawings.

DETAILED DESCRIPTION

For clarity, only those steps and elements which are useful to the understanding of the present invention have been shown and will be described hereafter. In particular, what use is made of the masks for the manufacturing of electronic products has not been illustrated, the present invention being compatible with any conventional use of photolithography masks.

Figure 1:
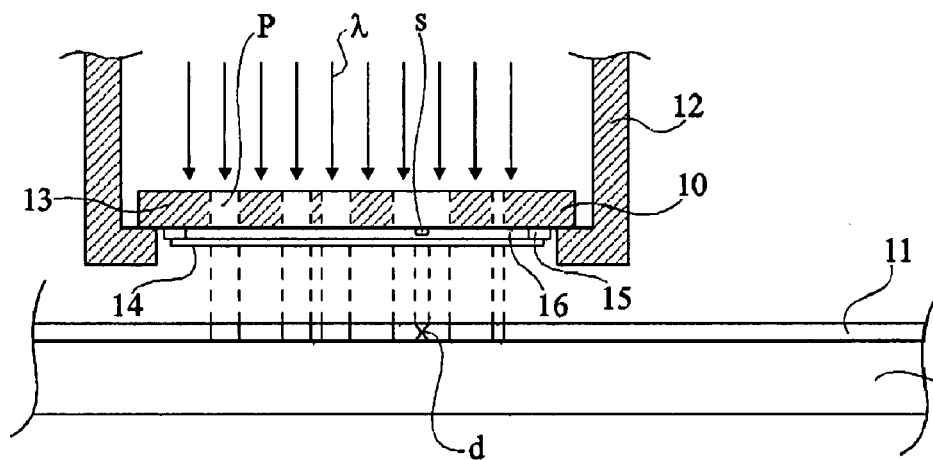
FIG. 1 partially shows, very schematically an usual example of an equipment using a mask.

FIG. 1 partially shows, very schematically and out of any scale consideration, an usual example of an equipment of exposure of a wafer 1 forming an integrated circuit manufacturing substrate, through a mask 10 for forming patterns.

Methods of pattern development by means of masks generally break up into several steps.

A first step comprises depositing a resist layer (positive or negative) 11 on semiconductor wafer 1.

Then, the assembly is exposed to a λ radiation through a mask 10 to insolate the resin according to patterns p defined by mask 10. In practice, a same mask 10 is displaced by equipment 12 partially shown in FIG. 1 above wafer 1 to reproduce the same patterns several times (typically, to manufacture several identical circuits).

After exposure, resin 11 is developed to only leave on the wafer the exposed or non-exposed portions according to the positive or negative character of the resin.

The resin mask thus formed on wafer 1 is used for subsequent steps of etching, implantation, etc. before, most often, complete removal of the remaining resin.

The above succession of steps is reproduced several times on a same wafer 1 with different masks of definition of the circuits to be formed.

A photolithography mask 10 used in the electronics industry comprises an active portion 13 defining areas which are opaque and transparent to a radiation λ. Active portion 13 is on one side of the mask opposite to a surface submitted to the radiation. The active portion, facing wafer 1, is protected by a film 14. In practice, film 14 is either an adhesive film placed on the mask surface, or a film stretched on a frame 15 forming a spacer with the mask surface, frame 15 then comprising a filter (not shown) for balancing the pressures between the outside and an interval 16 defined between active portion 13 and film 14. Film 14 is used to avoid for particles to directly deposit on the mask, on the active portion side, and interval 16 is used to space apart from active portion 13 film 14 on which particles deposit. Any particle, even of small size, (typically, between some fifty and a few hundreds of μm) likely to be in the installation may, if it is very close to active portion 13 (thus, in interval 16) generate a defect on the circuits. However, such particles are not disturbing if they are far enough from the active portion. The pressure-balancing filter avoids for such particles to enter interval 16.

Photolithography masks are one of the most critical elements of the electronic circuit manufacturing chain since the smallest defect on a mask generates a defect on all the manufactured circuits.

Although all the steps are performed under controlled atmosphere in "clean rooms", gas compounds remain present, even in low concentration in the different equipments, including in the photolithography equipments. Now, the particle filter is not sufficient to prevent gas molecules from penetrating into interval 16. Once in the interval, the step of exposure to light beams facilitates the growth on active portion 13 of the mask (in interval 16) of salts (s, FIG. 1) originating from the gas compounds present in the installation. Such salts generate defects d in the pattern reproduced on resin 11, and thus possible defects in the circuits.

In the semiconductor circuit manufacturing example, the salts which most often deposit are most often based on ammonia $(NH_4)_i X_y$, where X designates an anion of type $SO_4^-$, $F^-$, $Cl^-$, $CH_3COO^-$, etc.

Although the masks are stored in tight boxes, and even though the boxes are regularly purged to increase the mask lifetime, salts end up accumulating at the mask surface.

It is thus imperative to regularly clean the photolithography masks to eliminate the salts forming at their surface. The duration of use of a mask between two cleanings is linked to the exposure times and to the power of the light source.

A feature of an embodiment of the present invention is to submit the masks to be cleaned to a processing at low pressure (lower than the atmospheric pressure) to obtain the vaporization of the salts accumulated at the mask surface, this thermal treatment being performed under pumping to carry off the obtained gases.

It cannot be envisaged to submit the masks used in the microelectronics industry to thermal treatments of several hundreds of degrees to obtain a phase change of the accumulated salts, since this would cause mask deformations. Further, the protection film which is generally placed on their active portion would melt at such temperatures.

The present invention takes advantage of the fact that if the respective sublimation temperatures of the different salts accumulated on a mask (especially ammonium sulfate) are of several hundreds of degrees at the atmospheric pressure, this temperature of phase change towards the gas state decreases along with the pressure and reaches, under pressures lower than 1 Pa, temperatures lower than some hundred degrees which are compatible with the thermal resistance of masks. However, excessive vacuums are also capable of damaging the mask by causing the separation or the tearing of certain layers. The present invention takes advantage from the fact that the usable temperature-pressure range is compatible with the thermal and depression resistances of the masks and provides a setting possibility to adapt to different masks, salts, and installations.

Figure 2:
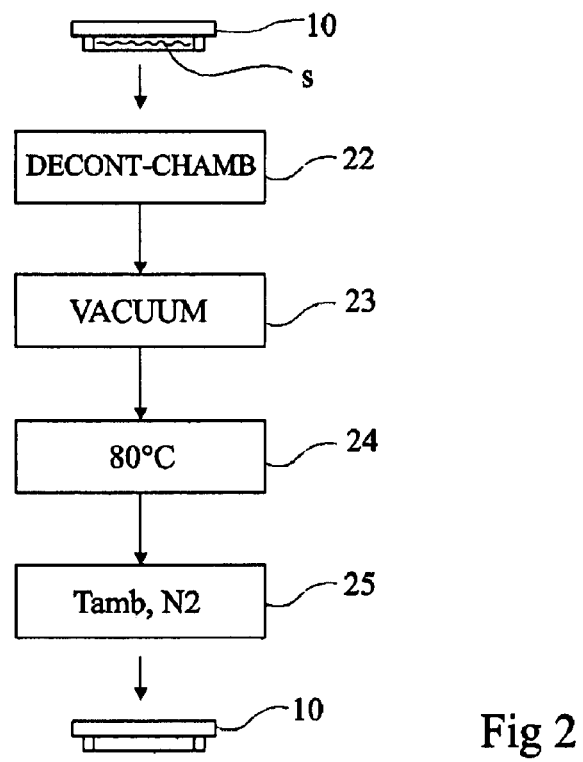
FIG. 2 very schematically illustrates in the form of blocks an embodiment of the mask cleaning method according to the present invention.

FIG. 2 very schematically illustrates in the form of blocks an embodiment of the mask cleaning method according to the present invention.

Figure 3:
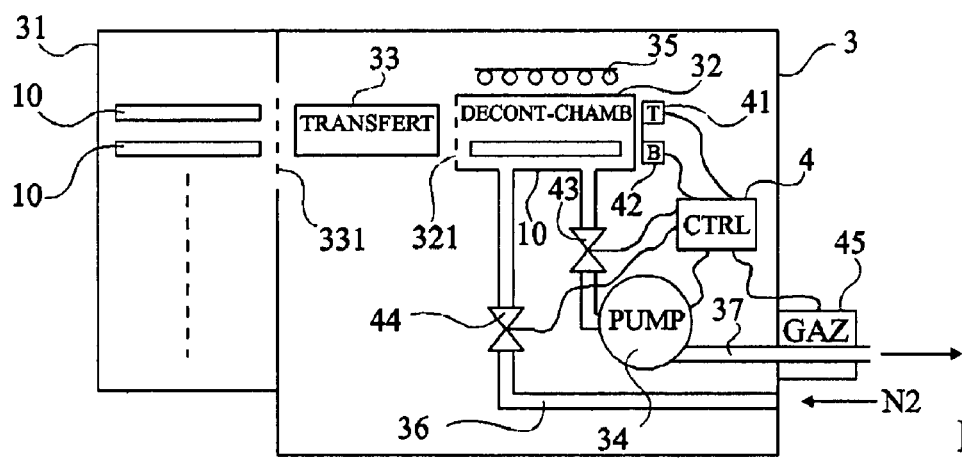
FIG. 3 very schematically shows an embodiment of a cleaning equipment according to the present invention.

FIG. 3 very schematically shows an embodiment of a mask cleaning equipment according to the embodiment of FIG. 2.

In an installation of the microelectronics industry, the different masks 10 are carried in boxes 31 in which they are maintained under controlled atmosphere. A mask 10 to be cleaned (comprising salts s at its surface) is introduced (block 22, DECONT-CHAMB) into a processing or decontamination chamber 32 of cleaning equipment 3. This step uses, for example, a robot 33 (TRANSFER) for transferring the mask to be processed between storage box 31 and chamber 32, this robot being displaced into equipment 3 between a gate 321 of the decontamination chamber and a gate 331 of the equipment, opposite to a corresponding door of box 31. Several masks may be introduced into chamber 32.

Decontamination chamber 32 is then submitted to a vacuum processing 23 (VACUUM) by means of a vacuum pump 34 (PUMP), a heating system 35 being activated (block 24, 80° C.) prior, at the same time, or subsequently to the starting of the placing under vacuum. The placing under vacuum and the temperature rise are preferably progressively performed to avoid damaging the mask (especially, film 14). The final temperature is selected to be lower than the maximum temperature that mask 10 can stand.

Preferably, the temperature is selected to obtain a sublimation of the salts according to the pressure acceptable by the mask and accessible by the pump. The above ranges provide examples of approximate temperatures selectable according to the pressure:

between 1 and 0.01 Pa, between 95 and 105° C.;
between 0.01 and 0.001 Pa, between 75 and 85° C.;
between 0.001 and $10^{-4}$ Pa, between 45 and 50° C.; and
between $10^{-5}$ and $10^{-6}$ Pa, between 30 and 35° C.

These ranges may vary according to the salts, to humidity, and to the material forming the mask.

For a given pressure, it is not disturbing to select a temperature greater than that required for the phase change. Conversely, this accelerates the salt sublimation, and thus the cleaning.

An example of a compromise is a temperature ranging between 75 and 100° C., preferably approximately 80° C., and a pressure ranging between $10^{-4}$ and 0.001 Pa, preferably lower than 0.001 Pa.

The vacuum processing enables, by maintaining the gas pumping by means of pump 34, evacuating the salts vaporized in the decontamination chamber and thus cleaning mask 10.

At the end of the vacuum thermal treatment, the decontamination chamber is (block 25, Tamb, $N_2$) set back to ambient temperature Tamb and at the atmospheric pressure, preferably under a neutral gas (for example, nitrogen). The processed mask is then evacuated from equipment 3 to box 31 by means of transfer robot 33. The cooling down may be natural or forced.

To carry off the gases and introduce nitrogen, chamber 32 communicates, for example, on the one hand with pump 34 of carrying off to the outside by a duct 37, and on the other hand with a gas feed duct 36. The ducts are equipped with controllable valves 43 and 44.

The heating to lower the phase change pressure may be general in the chamber or local by using a light beam or laser. An advantage of a local heating is to focus the thermal treatment on the surface on which the salts deposit. This mask surface (generally, a quartz) stands higher temperatures than the rest of the mask which comprises, among others, plastic parts. This enables obtaining a higher local temperature with less pressure constraints, for example, approximately 200° C. under 10 Pa, without damaging the mask.

Cleaning equipment 3 is preferably controlled by a control unit 4 (CTRL), for example, a programmable automaton or a computer, which exploits information provided by temperature (T) and pressure (P) sensors 41 and 42 in the decontamination chamber, and appropriately controls vacuum pump 34, heating system 35, and valves 43 and 44. Unit 4 also controls the mask transfer between box 31 and the decontamination chamber.

The vacuum thermal treatment (blocks 23 and 24) in the decontamination chamber is maintained for a time period enabling disappearance of the salts from the mask surface.

According to a first embodiment, this disappearance is visually checked through a porthole (not shown) of decontamination chamber 32 enabling seeing the mask surface.

According to another embodiment, this checking is performed by analyzing the gases coming out of decontamination chamber 32. For this purpose, duct 37 for carrying off the gases from vacuum pump 34 crosses an analyzer 45 (GAZ) having its results, preferably, communicated to unit 4 to stop the vacuum thermal treatment when the concentrations of gases originating from the salts ($SO_4^-$, $F^-$, $Cl^-$, $NH_3$, $CH_3COO^-$, etc.) are lower than thresholds. As a variation, the analyzer is placed between chamber 32 and pump 34. The thresholds are selected according to the desired cleaning quality.

According to another embodiment, the processing time is programmed after having been experimentally validated for masks of the same type.

An advantage of the present invention is that the performed cleaning reintroduces no contaminants for subsequent uses of the mask.

Another advantage of the present invention is that the absence of use of aqueous solutions eases its implementation in clean rooms used for electronic circuit manufacturing.

An advantage of a processing in a clean room of the electronics industry is that the air is generally better controlled therein than in mask manufacturing installations, which improves the mask cleanness. Another advantage is that this then avoids transfer of the masks to be cleaned towards other installations.

An example of application of the present invention relates to installations for manufacturing electronic circuits on wafers, for example, made of a semiconductor material.

Another example of application of the present invention relates to installations for forming optical devices using masks for the photolithography steps.

Of course, the present invention is likely to have various alterations, modifications, and improvements which will readily occur to those skilled in the art. In particular, although the present invention has been more specifically described with an application to the electronics industry, it more generally applies to any industry in which photolithography masks likely to be in the presence of gases forming salts at the mask surface are used. Further, the practical implementation of the present invention based on the functional indications given hereabove is within the abilities of those skilled in the art, especially as to the processing durations and the times of temperature rise, of pressure decrease, and of setting back to the atmosphere.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for cleaning masks used for photolithography steps, comprising at least one step of thermal treatment under pumping at a pressure lower than atmospheric pressure and at a temperature greater than ambient temperature, wherein the thermal treatment is carried on as long as a concentration of at least one species of sublimated gas from contaminants is greater than a threshold.

2. The method of claim 1, wherein the temperature of the low-pressure thermal treatment is lower than 100° C., preferably on the order of 80° C.

3. The method of claim 1, wherein the thermal treatment is performed under a pressure lower than 1 Pa, preferably lower than 0.001 Pa.

4. The method of claim 1, wherein the thermal treatment is obtained by a radiation focused on the surface to be cleaned.

5. The method of claim 1, comprising, at the end of the thermal treatment, a step of setting back to atmospheric pressure under a neutral gas.

6. The method of claim 1, wherein the thermal treatment is carried on as long as salts are present at a mask surface.

7. A method for cleaning a mask with a surface contaminant, comprising sublimating the contaminant at a temperature of less than 100° C. in a chamber and determining whether the sublimating step is successful by ascertaining a concentration of at least one gaseous substance in the chamber.

8. The method according to claim 7, wherein the temperature during the sublimating step is approximately 80° C.

9. The method according to claim 7, wherein the sublimating step comprises decreasing a pressure in the chamber to less than 1 Pa.

10. The method according to claim 9, wherein the sublimating step comprises decreasing the pressure in the chamber to less than 0.001 Pa.

11. The method according to claim 7, further comprising restoring atmospheric pressure in the chamber by introducing a neutral gas.

12. The method according to claim 7, wherein the determining step comprises visually inspecting the mask for presence of the contaminant.

13. The method according to claim 7, further comprising:
   comparing the concentration of the at least one gaseous substance with a predetermined threshold; and
   terminating the sublimating step if the concentration of the at least one gaseous substance is less than the predetermined threshold.

14. The method according to claim 7, wherein the determining step comprises measuring a predetermined elapsed time.

15. The method according to claim 7, wherein the mask is cleaned without exposure to ambient air.

* * * * *